United States Patent
Wurzinger et al.

(10) Patent No.: US 9,525,925 B2
(45) Date of Patent: Dec. 20, 2016

(54) SENSOR WITH MOVABLE PART AND BIASING

(75) Inventors: Christoph Bernhard Wurzinger, Weiz (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 778 days.

(21) Appl. No.: 13/035,896

(22) Filed: Feb. 25, 2011

(65) Prior Publication Data

US 2012/0217171 A1 Aug. 30, 2012

(51) Int. Cl.
| | | |
|---|---|---|
| *G01P 15/00* | (2006.01) | |
| *H04R 1/04* | (2006.01) | |
| *G01C 19/5776* | (2012.01) | |
| *G01P 15/125* | (2006.01) | |
| *H04R 3/00* | (2006.01) | |
| *H04R 19/00* | (2006.01) | |
| *H04R 19/04* | (2006.01) | |

(52) U.S. Cl.
CPC .............. *H04R 1/04* (2013.01); *G01C 19/5776* (2013.01); *G01P 15/125* (2013.01); *H04R 3/00* (2013.01); *H04R 19/005* (2013.01); *H04R 19/04* (2013.01)

(58) Field of Classification Search
CPC .............................. H04R 1/04; G01C 19/5776
USPC .................................................. 204/406, 409
See application file for complete search history.

(56) References Cited

U.S. PATENT DOCUMENTS

| | | | | | |
|---|---|---|---|---|---|
| 5,095,750 | A | * | 3/1992 | Suzuki et al. | 73/514.19 |
| 5,563,343 | A | * | 10/1996 | Shaw et al. | 73/514.18 |
| 5,610,335 | A | * | 3/1997 | Shaw et al. | 73/514.36 |
| 5,612,494 | A | * | 3/1997 | Shibano | 73/514.32 |
| 5,977,803 | A | * | 11/1999 | Tsugai | 327/94 |
| 6,149,190 | A | * | 11/2000 | Galvin et al. | 280/735 |
| 6,170,332 | B1 | * | 1/2001 | MacDonald et al. | 73/514.38 |
| 6,199,874 | B1 | * | 3/2001 | Galvin et al. | 280/5.514 |
| 6,257,061 | B1 | * | 7/2001 | Nonoyama et al. | 73/514.32 |
| 6,483,322 | B2 | * | 11/2002 | Aoyama et al. | 324/661 |
| 6,668,614 | B2 | * | 12/2003 | Itakura | 73/1.38 |
| 6,848,310 | B2 | * | 2/2005 | Goto | 73/514.32 |
| 6,935,176 | B2 | * | 8/2005 | Goto et al. | 73/514.32 |
| 7,109,727 | B2 | * | 9/2006 | Hayakawa et al. | 324/679 |
| 7,168,320 | B2 | * | 1/2007 | Murata et al. | 73/514.32 |
| 7,287,429 | B2 | * | 10/2007 | Umemura et al. | 73/514.32 |
| 7,432,724 | B2 | * | 10/2008 | Goto | 324/661 |
| 7,642,913 | B2 | * | 1/2010 | Hayakawa | 340/540 |
| 7,750,767 | B2 | * | 7/2010 | Jeong et al. | 335/78 |
| 7,788,977 | B2 | * | 9/2010 | Nagata | 73/504.12 |
| 2003/0070484 | A1 | * | 4/2003 | Itakura | 73/514.32 |
| 2005/0210980 | A1 | * | 9/2005 | Umemura et al. | 73/514.32 |
| 2007/0152682 | A1 | | 7/2007 | Ungaretti et al. | |
| 2008/0122454 | A1 | | 5/2008 | Kato | |
| 2010/0013501 | A1 | | 1/2010 | Boom | |
| 2010/0307243 | A1 | | 12/2010 | Prandi et al. | |
| 2011/0023605 | A1 | | 2/2011 | Tripoli et al. | |

FOREIGN PATENT DOCUMENTS

CN          1904533 A       1/2007

* cited by examiner

*Primary Examiner* — Laura Martin
*Assistant Examiner* — Samir M Shah
(74) *Attorney, Agent, or Firm* — Harrity & Harrity, LLP

(57) ABSTRACT

Methods and apparatuses are provided wherein a sensor which comprises at least two electrodes and a movable part is alternately biased with at least two different voltages.

11 Claims, 5 Drawing Sheets

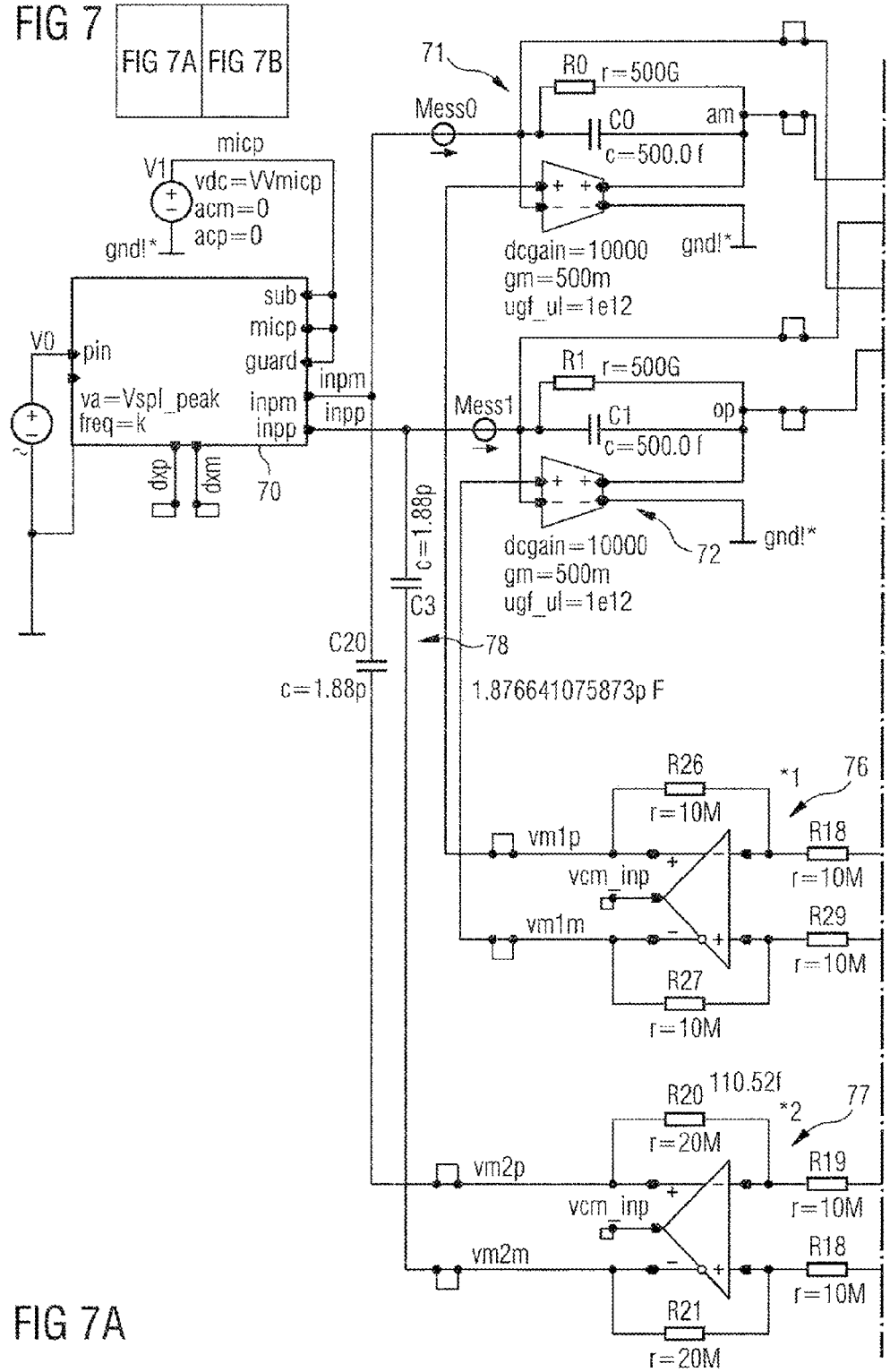

SENSOR WITH MOVABLE PART AND BIASING

FIELD OF THE INVENTION

The present invention relates to sensors comprising a movable part and to readout and amplification of a signal output by the sensor.

BACKGROUND

Sensors with movable parts are used in many applications, for example as acceleration sensors or as sound sensors, i.e. microphones. In some types of these sensors, a movable object is displaced with respect to two or more electrodes arranged close to the moving object, and change of capacitance between the movable object and the electrodes caused by this movement may be read out from the sensor. For example, the movable object may be a membrane of a microphone.

Such sensors may for example be implemented in the form of microelectromechanical systems (MEMS), which are also referred to as micro machines or systems based on microsystems technology.

As the signal provided by the sensor in many cases is comparatively weak, the signal is usually amplified before it is further processed.

BRIEF DESCRIPTION OF THE SEVERAL VIEWS OF THE DRAWINGS

FIGS. 7A and 7B, collectively referred to hereinafter as FIG. 7, show a circuit diagram of an apparatus according to an embodiment.

DETAILED DESCRIPTION OF THE INVENTION

Figure 1:
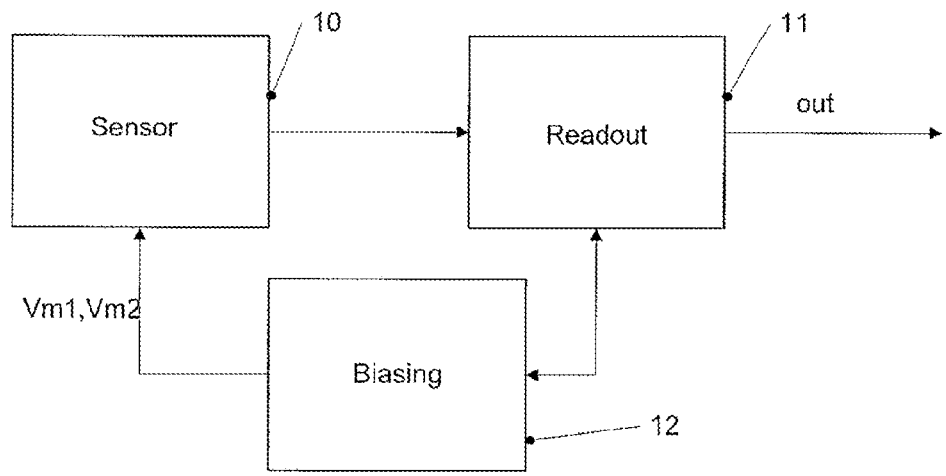
FIG. 1 shows a block diagram of an apparatus according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising on or more intervening elements. Furthermore, it should be appreciated that functional blocks or units shown in the drawings may be implemented as separate circuits in some embodiments, but may also be fully or partially implemented in a common circuit in other embodiments. In other words, the use of different functional blocks or units in the drawings is intended to give the clear understanding of various functions performed by the corresponding apparatus, but is not to be construed as indicating that the functional blocks have to be implemented as separate physical units.

It is further to be understood that any connection which is described as being wire-based in the following specification may also be implemented as a wireless connection unless noted to the contrary.

It should be noted that the drawings are provided to give an illustration of some aspects of embodiments of the present invention and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components in implementations of the respective embodiment.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In the following embodiments, sensors having movable parts and at least two electrodes are described. With such a sensor, the movable part is displaced with respect to the electrodes due to an event to be monitored by the sensor, and this displacement causes a change of capacitance between the electrodes and the movable object indicative of the event, which can then be detected electrically. For example, in case of a microphone, i.e. a sound sensor, the event may be an incoming sound wave, and in case of an acceleration sensor the event may be the sensor being accelerated. The electrodes may be biased with respect to the movable part, which may be effected by applying a voltage to the electrodes, the movable part or both. An example for such a sensor will be explained later in greater detail.

Turning now to the Figures, in FIG. 1 a block diagram according to an embodiment of the present invention is shown. The apparatus shown in FIG. 1 comprises a sensor 10, which in the embodiment of FIG. 1 is a sensor comprising a movable part arranged adjacent to, for example between, at least two electrodes. An output of sensor 10 is coupled with readout circuitry 11, which outputs an output signal out. Sensor 10 may for example be a microphone or an acceleration sensor, but is not limited thereto.

Furthermore, FIG. 1 comprises biasing circuitry 12 configured to bias the electrodes of sensor 10 with respect to the movable part alternately with at least two different voltages Vm1, Vm2, for example by applying the voltages to the electrodes and/or to the movable part. Biasing circuitry 12 may be coupled with readout circuitry 11. For example, in an embodiment readout circuitry 11 may change the readout or perform the readout depending on the switching between the voltages Vm1 and Vm2. In another embodiment, readout circuitry 11 may additionally or alternatively control biasing circuitry 12 regarding the switching between the voltages Vm1, Vm2 and/or the magnitude of these voltages, thus providing a feedback path from sensor 10 via readout circuitry 11 and biasing circuitry 12 back to sensor 10.

Through alternately biasing the first electrode and the second electrode of sensor 10 with voltage Vm1 and voltage Vm2 and selecting the voltages appropriately as will be explained further below, an amplification of the sensed signal may be obtained. This amplification, which may be seen as a type of superregenerative amplification, exploits the fact that a sensor as described above may be approximated as a second order linear system which has a free response with an envelope y(t) that can be approximated by $$y(t) = y(0) \cdot e^{-\frac{t-t_{dl}}{\tau}} \quad (1)$$

wherein τ is a time constant and $t_{dl}$ is a delay time. The time constant τ can be either positive (stable state) or negative (unstable state). A stable state of the movable mass is a state where at least absent external forces like acoustic forces the movable part returns to an equilibrium position, while in its unstable state a displacement from the equilibrium position increases. The time constant τ may be varied by applying different voltages to the electrode of a sensor. In particular, depending on the choice of voltage, the time constant τ may be made positive or negative. By periodically switching between a positive and a negative time constant at a so called quenching frequency, an amplification may be obtained. The quenching frequency for an arrangement like the one shown in FIG. 1 may be increased using a feedback like the one mentioned above.

Figure 2:
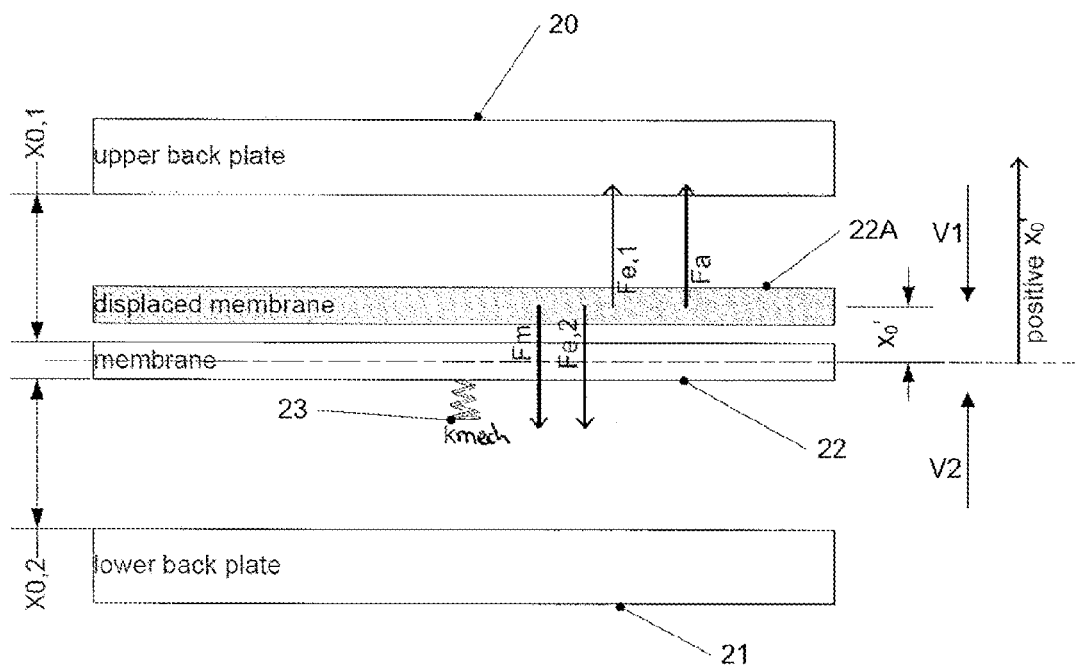
FIG. 2 shows an example for a sensor used in some embodiments.

In FIG. 2, an example for a sensor in form of a microphone is shown. The microphone of FIG. 2 may be manufactured as a microelectromechanical system (MEMS), for example based on a silicon substrate.

The microphone shown in FIG. 2 comprises an upper back plate 20 and a lower back plate 21 to which a voltage may be applied, i.e. they may be used as first and second electrodes, respectively.

A membrane 22 is located between upper back plate 20 and lower back plate 21. In a zero position the distance between membrane 22 and upper back plate 20 is X0,1, and the distance between membrane 22 and lower back plate 21 is X0,2. Due to mechanical and/or electrical forces, membrane 22 may be displaced, for example to a location where a displaced membrane 22A is shown. The displacement is designated $x'_0$.

If the microphone of FIG. 2 is used in the embodiment of FIG. 1 the voltages Vm1, Vm2 may be alternately applied to upper back plate 20 and lower back plate 21, i.e. at one time the voltage Vm1 is applied to upper back plate 20 and lower back plate 21, and at a different time the voltage Vm2 is applied to upper back plate 20 and lower back plate 21, or may be alternately applied to membrane 22.

An electrical force between the displaced membrane 22A and the upper back plate 20 is labeled Fe,1, and an electric force between displaced membrane 22a and lower back plate 21 is labeled Fe,2. Fa is a force caused by an acoustic sound wave, and Fm is a mechanical force which may be symbolized by a spring 23 with spring constant $k_{mech}$. It is to be noted that in such systems usually no real "spring" is present, but for example the membrane may be suspended between mountings, and thus a displacement of the membrane from its zero position causes a restoring force.

$V_1$ is a voltage between upper back plate 20 and (displaced) membrane 22A, and $V_2$ is a voltage between lower back plate 21 and (displaced) membrane 22A. The arrows next to voltages, distances and forces indicate the "positive" direction of the respective quantity, i.e. a quantity in the direction of the arrow is positive in the following equations and explanations, and a quantity in the opposite direction is negative.

For simpler equations, a common mode voltage $V_c$ and a differential mode voltage $V_d$ is defined such that $$V_1 = V_c + V_d/2 \quad (2)$$

$$V_2 = V_c + V_d/2 \quad (3)$$

The duration of a rising phase, i.e. a phase where the system is unstable, will be referred to as $t_r$, and the duration of a decaying phase, i.e. a phase where the system is stable, will to referred to as $t_d$, and the above-mentioned quenching frequency will be labeled $f_q = 1/T_q$, wherein $T_q > t_r + t_d$.

Next, it will be described in some more detail how the above-explained principles may be implemented for a microphone like the one shown in FIG. 2 or a similar sensor where a movable object like a membrane moves between two electrodes. The dynamics of such a system can be approximated by a second order system. The system dynamics depend on the biasing condition of capacitors formed by the electrodes and the movable part. For large biasing resistances, the charge stored inside the capacitor can be considered constant, and the dynamics are approximately independent of the applied voltage. If, however, the biasing resistances are small, the voltage across the capacitor plates (for example the electrodes like upper back plate 20 and lower back plate 21 as well as the membrane 22) can be considered constant, and the system dynamics change with the bias voltage. The system can at least approximately be described by the transfer functions $H_a(s)$ and $H_e(s)$ according to $$H_a(s) = \frac{-\frac{F_n}{m}}{s^2 + s\frac{r}{m} + \frac{k'}{m}} \quad (4)$$

and $$H_e(s) = \frac{-\frac{F_e}{m}}{s^2 + s\frac{r}{m} + \frac{k'}{m}}, \quad (5)$$

$H_a(s)$ describing the membranes displacement as a function of acoustic forces and $H_e(s)$ describing the membranes displacement as a function of electrostatic forces. For ease of reference, the microphone shown in FIG. 2 will be used for the following explanations. It is, however, to be understood that the principles explained below may also be applied to other sensors where a movable object moves between at least two electrodes, for example acceleration sensors.

m is the membrane's effective mass, r is a viscous damping, and $k' = k_{mech} - k_{el}$ ($V_c$) represents the effective spring constant, $k_{mech}$ being the mechanical spring constant and $k_{el}$ being the "spring constant" caused by electrostatic forces and being dependent on the bias voltage.

The physically possible free responses of such a device follow an envelope summarized in the table below:

| Type | τ | $t_{dl}$ | condition |
|---|---|---|---|
| rising | $\dfrac{2Q}{\omega_0(1-\xi)}$ | $\tau \ln\left(\dfrac{1}{2} + \dfrac{1}{2\xi}\right)$ | $\xi > 1$ |

-continued

| Type | τ | $t_{dl}$ | condition |
|---|---|---|---|
| decaying | $\frac{2Q}{\omega_0}$ † | 0 † | $Q > \frac{1}{2}$ |
| decaying | $\frac{2Q}{\omega_0(1-\xi)}$ ‡ | $\tau \ln\left(\frac{1}{2} + \frac{1}{2\xi}\right)$ ‡ | $\xi < 1$ |

†oscillatory result.
‡not valid for $\xi \to 0$.

wherein $$\omega_0^2 = \frac{k'}{m}; \frac{\omega_0}{Q} = \frac{r}{m}; \xi = \left|\sqrt{1-4Q^2}\right| = \left|\sqrt{1-4\frac{k'm}{r^2}}\right| \quad (6)$$

By changing $V_c$, for example by applying different bias voltage to upper back plate 20 and lower back plate 21 and/or to membrane 22 in FIG. 2, k' is changed, and therefore the free response envelope of the system is either exponentially rising or decaying. This can be used in some embodiments to essentially use the microphone itself as an amplifier.

Figure 3:
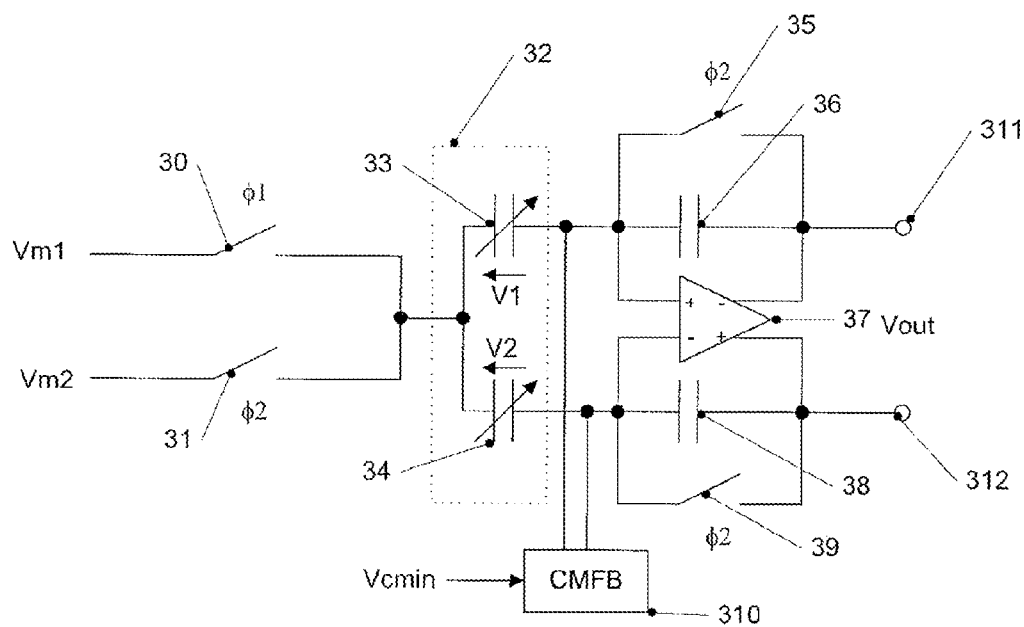
FIG. 3 shows a circuit diagram of an apparatus according to an embodiment.

In FIG. 3, an embodiment of a circuit using these principles are shown. The circuit of the embodiment of FIG. 3 is a circuit not using feedback.

In the circuit diagram of FIG. 3, a sensor 32 is represented by two variable capacitances 33, 34. Capacitance 33 may be the capacitance between a first electrode and a moving object, for example between upper back plate 20 and membrane 22, and capacitance 34 may be a capacitance between a second electrode and the moving object, for example between lower back plate 21 and membrane 22.

In the embodiment of FIG. 3, $\phi_1$ and $\phi_2$ are two phases of a non-overlapping clock which control two switches 30, 31, respectively. In other words, switches 30, 31 are alternately closed, thus applying either a voltage Vm1 or a voltage Vm2 to the movable object of sensor 32, for example to a membrane. A common mode feedback circuitry 310 which is fed an (input) common mode voltage Vcmin biases the electrodes, for example, upper back plate 20 and lower back plate 21 of the arrangement of FIG. 2. Coupled to the electrodes of sensor 32 is a differential amplifier 37. Parallel to differential amplifier 37, on both sides capacitors 36, 38 and switches 36, 39 are provided as shown in FIG. 3. Switches 35, 39 are switched depending on signal $\phi_2$, i.e. these switches are closed when also switch 31 is closed. At outputs 311, 312 an output voltage Vout may be tapped.

Next, the operation of the embodiment shown in FIG. 3 will be described in some more detail. For the following explanation, a sensor like the one shown in FIG. 2 will be used, however, it is to be understood that other sensors having a movable object between two electrodes may also be used.

The two voltages Vm1, Vm2 are chosen such that when voltage Vm1 is applied the system becomes unstable and when voltage Vm2 is applied the system is stable. This can be obtained by setting $k_{el}(V_c)$ according to $$k_{el}(V_c) = \frac{4zV_c^2}{x_0^3} \quad (7)$$

Such that it is greater than or smaller than $k_{mech}$, respectively, such that the effective spring constant k' becomes negative or positive, respectively.

z in equation (7) is equal to $$z = \frac{\varepsilon_0 R^2 \pi \left(1 - \frac{r_h^2 \rho_h}{(r_h + x_0)^2}\right)}{2},$$

wherein $\varepsilon_0$ is the dielectric constant, R is the radius of the in this example circular back plate electrodes and/or the membrane in FIG. 2, and the term in brackets is a correctional factor which is approximately one, $r_h$ being a radius of holes in the upper and lower back plates and $\rho_h$ being a density of such holes. Such holes for example allow sound to reach the membrane. In other embodiments, no holes may be used, and the corresponding term may be omitted. In still other embodiments, non-circular back plate electrodes and/or membranes may be used, in which case in the above expression for z the term $R^2\pi$ is replaced by the area of the back plate electrodes and/or membrane.

In other words, when signal $\Phi_2$ closes switch 31, the voltages $V_1$ and $V_2$ are set to Vm2 which is smaller than the so-called pull-in voltage, i.e. the voltage necessary to create an unstable system. Thus the system is stable, and the membrane displacement $x'_0$ is a result of the acoustic force Fa acting against the mechanical restoration force Fm.

When now signal $\Phi_1$ closes switch 30 and on the other hand switch 31 is opened, the voltage Vm1 is used as a biasing voltage which is above the pull-in voltage such that the system becomes unstable and the membrane starts to increase its displacement exponentially. In other words, a displacement caused by an acoustic force while switch 31 was closed is now amplified when switch 30 is closed.

In the embodiment of FIG. 3, the change of the bias voltage from Vm2 to Vm1 and back is a common mode signal that is not amplified by the differential amplifier 37 provided. On the other hand, the membrane displacement changes the capacitances 33, 34 of the sensor in opposite directions. The resulting charge difference is converted to a voltage across the capacitances 36, 38 which are configured as feedback capacitors in FIG. 3. The output voltage Vout is then $$V_{out}(t_r) = \frac{2C_0 V_c}{C_F x_0} x'_0(t_r) \quad (8)$$

wherein $C_F$ is the capacitance of capacitances 36, 38, $C_0$ is the nominal MEMS capacitance. It should be noted that in equation (8), the capacitance change has been linearized, which is a good approximation.

The gain of the amplification provided by this concept is effected during the rising phase and depends on the characteristics of the sensor and the duration of the rising phase $t_r$. The membrane displacement at the end of the rising phase is $$x'_0(t_r) = x'_0(0) \cdot \underbrace{e^{\frac{t_r - t_{dl,r}}{\tau_r}}}_{gain}, \quad (9)$$

where $x_0'(0) = F_a/k'$ is the displacement at the beginning of the rising phase, $t_{dl,\,r}$ is a delay in the rising phase and $\tau_r$ is a time constant for the rising phase. Examples for the values of these parameters and also the parameter ξ for the rising phase and the decaying phase are shown in the table below.

| Phase | $V_c$ [V] | τ [s] | $t_{dl}$ [s] | ξ |
|---|---|---|---|---|
| rising | 10 | −8.5371e−6 | 925.4586e−9 | 1.2586 |
| decaying | 0 | 27.3292e−6 | 1.1753e−6 | 919.2163e−3 |

It should be noted that these numerical values serve only as illustration and may vary from sensor to sensor.

It should be noted that depending on the values of $t_r$ and $t_d$ there may be a memory effect, i.e. a current initial displacement $x_0'(0)$ may influence a following initial displacement in the next decaying phase. The influence may be estimated by a discrete time system with the following impulse response $$h_i[n] = \left(e^{-\frac{t_r-t_{dl,r}}{\tau_r} - \frac{t_d-t_{dl,d}}{\tau_d}}\right)^n = a^n \qquad (10)$$

wherein a is a parameter. It should be noted that this represents an estimation only as for this equation initially non-moving membranes are assumed, however, at the transition from rising to decaying phase the membrane usually is moving.

The z-transform of the impulse response of equation (10) is $$H_i(z) = \frac{1}{1 - az^{-1}} \qquad (11)$$

which corresponds to the impulse response of a low pass filter/lossy integrator. A parameter a equal to zero would lead to no memory, which would be the ideal case for a pure amplifier. However, in some embodiments, an integrating functionality, for example as part of a delta sigma modulator, may be desirable and implemented, for example if the stable bias voltage, i.e. the bias voltage in the decaying phase, has a differential component force feedback, which will be described later.

To achieve a stable operation, in an embodiment the parameter a is set to be smaller than one. This leads to the following constraint:

$$-\frac{t_r - t_{dl,r}}{\tau_r} < \frac{t_d - t_{dl,d}}{\tau_d}, \qquad (12)$$

which puts a constraint on the values $t_r$, $t_d$ and therefore, as explained above, limits the maximum achievable quenching frequency as $T_q$ is greater than $t_r+t_d$. The quenching frequency determines the frequency of readout, or, in other words, the sampling frequency. On the other hand, limiting $t_r$ may limit the gain. Therefore, depending on the application, the parameters may be selected to either achieve a high gain or a high quenching frequency, depending on the necessities.

For such a small parameter a, a robust operation may be obtained in some embodiments as the membrane will return to an equilibrium position and even recover from a potential dynamic pull-in.

Figure 5:
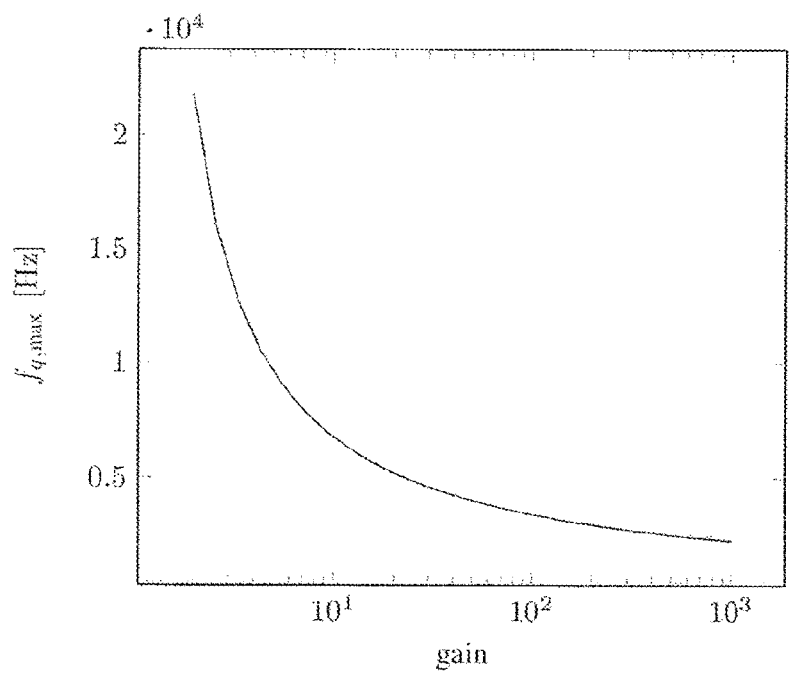
FIG. 5 shows a curve for illustrating some features of some embodiments.

To give an example for the thus caused relationship between gain and quenching frequency, FIG. 5 shows the estimated quenching frequency for the embodiment of FIG. 3 versus gain.

In the embodiment of FIG. 3, the system dynamics are changed by switching the bias voltage between two discrete levels, being simple to implement. In other embodiments, a switching between more than two voltages may be implemented.

Figure 4:
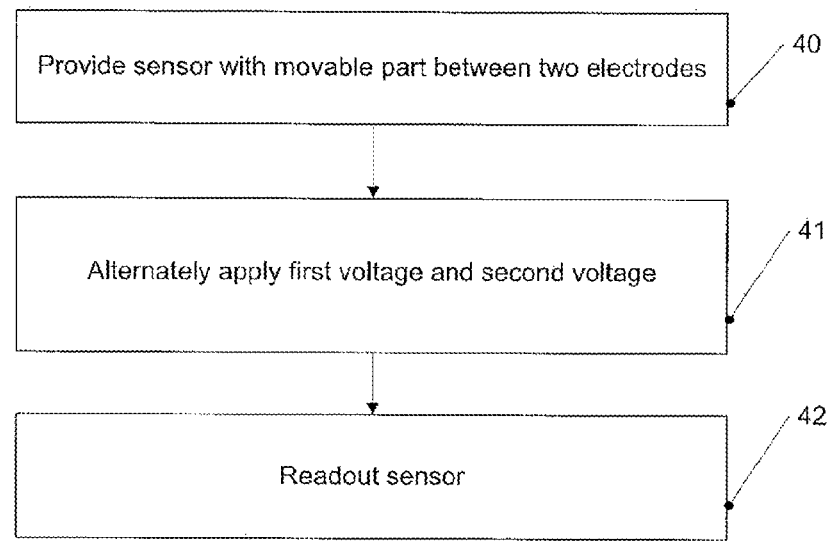
FIG. 4 shows a flow chart illustrating a method according to an embodiment.

In FIG. 4, an embodiment of a method is schematically shown. The method shown in FIG. 4 may be implemented in the embodiment of FIG. 1 or 3 and/or may be implemented using the sensor shown in FIG. 2, but may also be implemented independently therefrom, for example with other sensors like acceleration sensors or with other circuitry connected to the sensor.

At 40, a sensor with a movable part between at least two electrodes, for example in form of a microelectromechanical system, is provided.

At 41, alternately a first voltage and a second voltage is applied between the electrodes and the movable part.

At 42, the micro electromechanical system is read out, for example while the first voltage is applied and/or while the second voltage is applied.

As already mentioned, with respect to the embodiment of FIG. 1, in some embodiment a feedback may be provided. While in the embodiments of FIGS. 3 and 4 no such feedback is provided, in other embodiments such a feedback may be present. For example, at 41 in FIG. 4 the alternately applying of the first voltage and second voltage may depend on a feedback loop. Further embodiments using feedback will be described next with reference to FIGS. 6 and 7.

Figure 6:
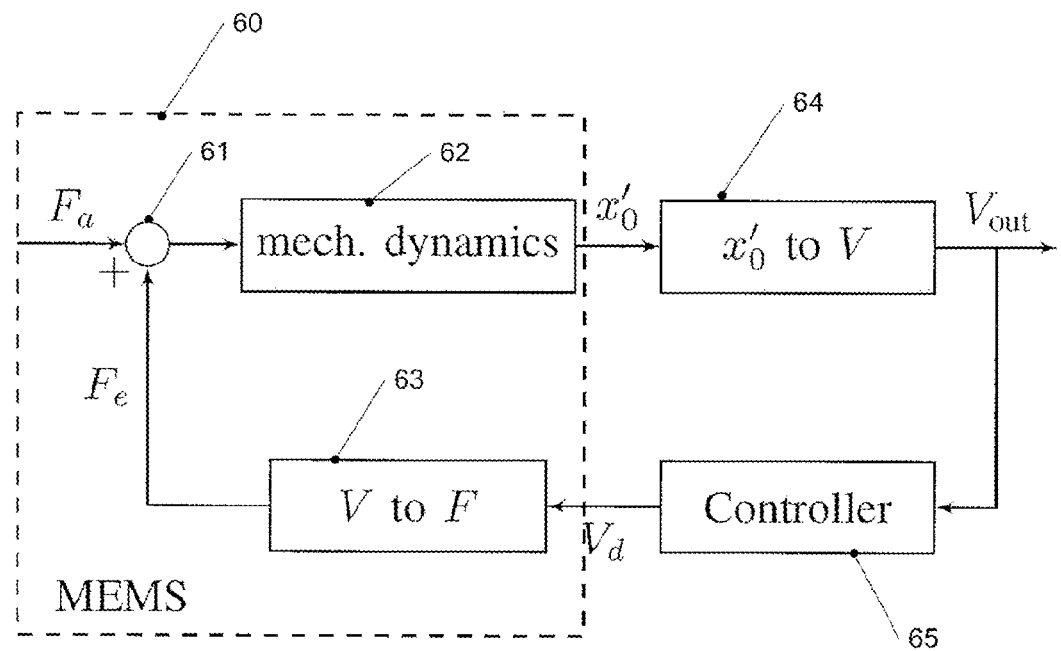
FIG. 6 shows a block diagram of an apparatus according to an embodiment.

In FIG. 6, a block diagram of an apparatus according to an embodiment comprising a feedback loop is shown. A sensor 60, in the embodiment of FIG. 6, a microelectromechanical system comprising a movable part and at least two electrodes, is provided. The sensor 60 receives an external force, in case of a microphone an acoustic force $F_a$, and an electric force due to biasing of the electrodes with respect to the movable part. These forces are added as symbolized by an adder 61 and cause mechanical dynamics of the system, i.e. movement of the movable part, as symbolized by block 2. The mechanical dynamics 62 result in a displacement $x_0'$, which, due to capacitance and therefore charge changes based on the movement, are converted to a voltage Vout as symbolized by a block 64.

The voltage Vout represents the sensed quantity and may be further processed, and is further fed to a controller 65 which generates a biasing voltage $V_d$ which at least partially depends on Vout. The voltage $V_d$ results in the electric force Fe as symbolized by a block 63 converting a voltage to the force.

It should be noted that the various blocks shown in FIG. 6 symbolize various functions, but are not to be construed as being actual entities in the system. For example, the forces acting on the movable part like a membrane are added automatically due to the laws of mechanics, and no explicit adder 61 is present, adder 61 just symbolizing this mechanical fact. Likewise, forces acting on a movable part "automatically" lead to mechanical dynamics as symbolized by block 62, and no specific entity is needed for this result. Similar considerations may hold true for other blocks, for example blocks 63 and 64.

To explain the operation of an embodiment with feedback loop like the embodiment of FIG. 6, a general state space model for the sensor, in this case microelectromechanical system 60, of the form $$\dot{q}(t) = Aq(t) + Bu(t) \quad (15)$$

$$y(t) = Cq(t) + Du(t) \quad (16)$$

with $$q(t) = \begin{bmatrix} x'_0 \\ \dot{x}'_0 \end{bmatrix} \quad (17)$$

$$u(t) = \begin{bmatrix} F_a(t) \\ V_c(t)V_d(t) \end{bmatrix}$$

will be used. The parameters A, B, C and D are defined as follows $$A = \begin{bmatrix} 0 & 1 \\ -\dfrac{k'}{m} & -\dfrac{r}{m} \end{bmatrix} \quad (18)$$

$$B = \begin{bmatrix} 0 & 0 \\ -\dfrac{1}{m} & -\dfrac{2z}{mx_0^2} \end{bmatrix}$$

$$C = \begin{bmatrix} 1 & 0 \end{bmatrix} \quad (19)$$
$$D = 0$$

The quantities not explained here have the same meaning as already explained with respect to FIGS. 1 to 5.

To illustrate the effects of the feedback loop, it is assumed that controller 65 uses the state variables membrane displacement and velocity of the membrane, i.e. $x'_0$ and $\dot{x}'_0$ or estimations thereof, $\dot{x}'_0$ being the derivate of $x'_0$ with respect to time, for the determination of the feedback, i.e. the determination of $V_d$ or variation thereof in FIG. 6. If corresponding gains, i.e. "amplifications" of $x_0'$ and $\dot{x}'_0$ for generating the feedback, are called $k_d$ and $k_v$, respectively, then a new system matrix $A_f$ replacing matrix A above can be written as $$A_f = \begin{bmatrix} 0 & 1 \\ -\dfrac{k'}{m} + k_d & -\dfrac{r}{m} + k_v \end{bmatrix} \quad (20)$$

By defining $$\omega_0^2 = \dfrac{k'}{m} - k_d; \quad (21)$$
$$\dfrac{\omega_0}{Q} = \dfrac{r}{m} - k_v$$

$$\xi = \left|\sqrt{1 - 4Q^2}\right| = \left|\sqrt{1 - 4\dfrac{m(k' - mk_d)}{(r - k_v m)^2}}\right| \quad (22)$$

(these definitions replace those of equations (6) for the current analysis of the feedback loop), closed loop transfer functions may be derived as $$H_a(s) = \dfrac{-\dfrac{F_a}{m}}{s^2 + s\dfrac{\omega_0}{Q} + \omega_0^2} \quad (23)$$

and $$H_e(s) = \dfrac{-\dfrac{F_e}{m}}{s^2 + s\dfrac{\omega_0}{Q} + \omega_0^2} \quad (24)$$

It can be seen from equation (21) that the values of $\omega_0^2$ and $\omega_0/Q$ can be chosen arbitrarily by adjusting the gains $k_d$, $k_v$, accordingly, for example by designing controller 65 of FIG. 6 appropriately. Thus, free response parameters and their time constants can be chosen arbitrarily as well, giving corresponding freedom in design of the system. Assuming for example zero membrane speed ($\dot{x}_0'=0$), the free response has the form $$\dfrac{x'_0(t)}{x'_0(0)} = e^{-\tfrac{\omega_0}{2Q}t}\cosh\!\left(\dfrac{\omega_0\sqrt{1-4Q^2}}{2Q}t\right) + \quad (25)$$
$$e^{-\tfrac{\omega_0}{2Q}t}\dfrac{1}{\sqrt{1-4Q^2}}\sinh\!\left(\dfrac{\omega_0\sqrt{1-4Q^2}}{2Q}t\right)$$

Figure 7B:
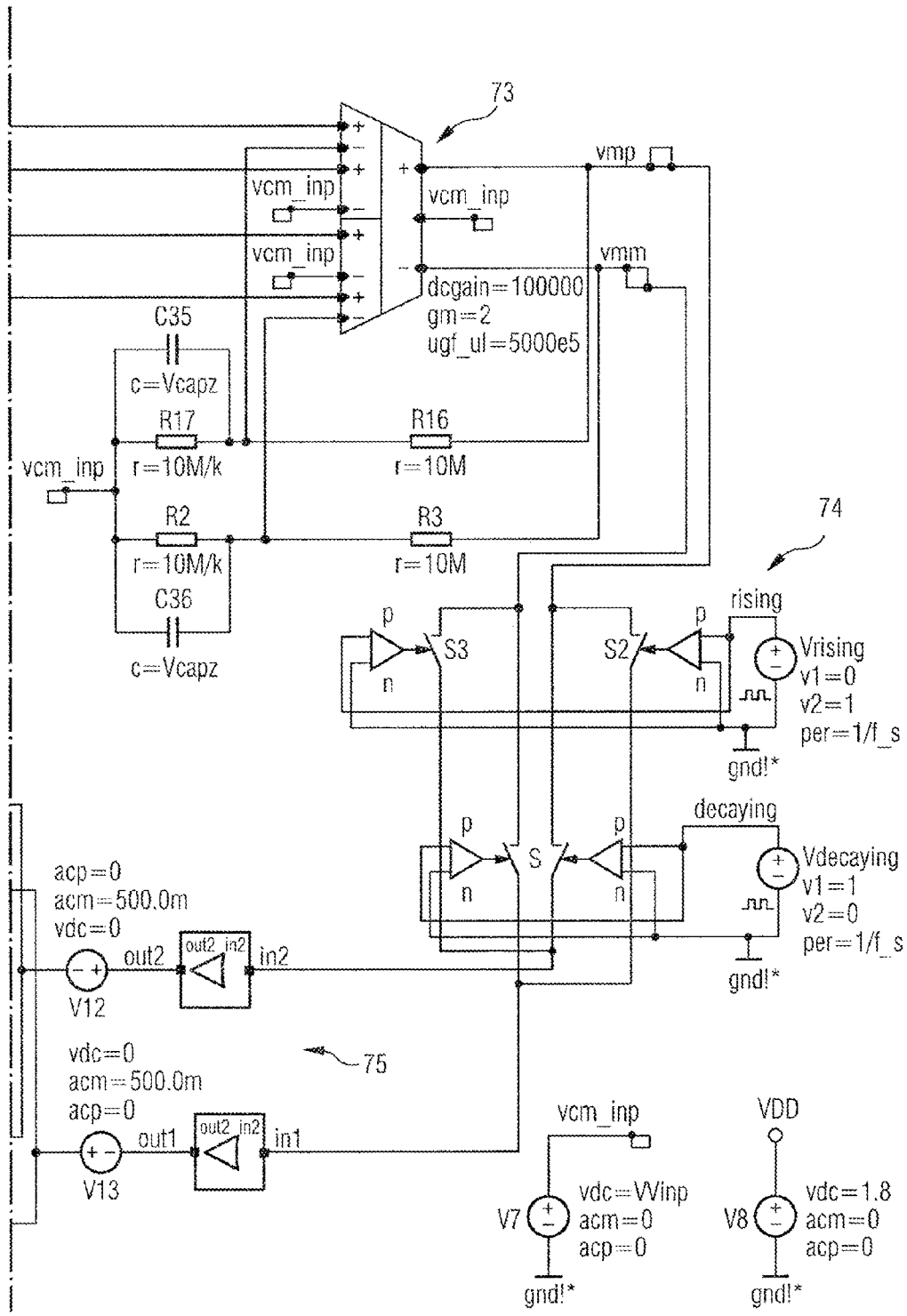

In some embodiments a sensor may have separate drive capacitances, i.e. capacitances which may be biased, and sense capacitances, i.e. capacitances for reading out the sensors. Such separate drive and sense capacitances are for example of a use in accelerometers or gyroscopes. On the other hand, in microphones like the ones shown in FIG. 2 often capacitances which are used both for driving and sensing, in the example embodiment of FIG. 2 the capacitance between upper back plate 20 and membrane 22 and between membrane 22 and lower back plate 21, are employed. A schematic circuit diagram where feedback may be applied with such a sensor is schematically shown in FIG. 7. It should be noted that any quantitative values regarding capacitances, voltages, gains etc. provided in FIG. 7 serve only for illustration purposes and are not to be construed as limiting, as other embodiments may use other values or other values. Moreover, in other embodiments other circuit structures may be used.

In the embodiment of FIG. 7, reference numeral 70 designates a sensor, in the example of FIG. 7 a microphone with two electrodes and a movable membrane as shown in FIG. 2. INPM and INPP designate connections of the sensor used for reading out the sensor and for variably biasing the sensor, in the embodiment of FIG. 7 for example connections to the two electrodes, e.g. back plates.

The connections INPM, INPP are coupled to negative inputs of differential amplifier arrangement 71 and 72, respectively, as shown. Each amplifier arrangement 71, 72 comprises a capacitance and a resistance parallel to the respective amplifier, the capacitance value of the capacitance being designated $C_F$ hereinafter. Furthermore, coupled to INPM, INPP are capacitances 78, the capacitance value of which are designated $C_C$ hereinafter and which serve as compensating capacitors. Each of the amplifier arrangements 71, 72 forces its corresponding capacitor plate or electrode, for example plate 20 or 21 in FIG. 2, to a voltage supplied to the respective non-inverting input of the respective operational amplifier, i.e. the input labeled with + in FIG. 7. This input, i.e. first feedback signal is supplied via a first feedback path comprising an amplifier arrangement 76. Amplifier arrangement 76 may have a gain of one or approximately one. To be able to sense charge variation due to membrane movement only, i.e. due to the event to be sensed by the sensor, and to discard an effect coming from a forced differential voltage change, i.e. a voltage change due to the feedback and the alternately applying of different voltages, a second feedback path providing a second feedback signal to the negative inputs of operational amplifier arrangement 71, 72 is provided via the compensating capacitors 78. An amplifier arrangement 77 drives the compensating capacitors 78. In an embodiment, the charge compensating capacitors 78 and a gain $A_c$ of amplifier arrangement 77 are chosen such that $$C_0 V_d = V_d(A_c-1)C_c \qquad (26)$$

By using a capacitor of the same size as the nominal capacitance of sensor 70, i.e. the capacitance with no bias voltage applied, for example a gain of two is selected. To obtain this, for example amplifier arrangement 77 driving the compensating capacitor 78 may have a gain of two or approximately two. In some embodiments, $C_C$ may be chosen to be slightly greater than $C_0$ to avoid a transmission zero in the open loop transfer function of the apparatus of FIG. 7.

With the elements of FIG. 7 discussed so far, the displacement of the membrane of sensor 70 is proportional to the sum of the voltages across the capacitances of amplifier arrangement 71, 72. To obtain the sum of these voltages which then correspond to the output signal of the sensor a differential difference amplifier arrangement 73 is provided. The differential difference amplifier arrangement 73 serves also as controller in the feedback loop for the first and second feedback paths of the embodiment of FIG. 7. In other words, through differential difference amplifier arrangement effectively the values for $k_d$ and $k_v$ mentioned above are determined. An output of differential difference amplifier arrangement 73 labeled VMP, VMM is fed to a switching arrangement 74 which serves for switching between the rising and decaying phase of the arrangement by effectively interchanging the outputs of differential difference amplifier arrangement 73. This effectively changes the signs of $k_d$ and $k_v$. In an embodiment, the gain of differential difference amplifier arrangement 73, i.e. $k_d$ and $k_v$, are selected such that through changing the signs a change is made between stable and unstable gain settings or, in other words, between rising and decaying phase. The output of switching circuitry 74 is supplied via an arrangement 75 to amplifier arrangements 76 and 77, respectively.

The amplifier structure of the embodiment of FIG. 7 may also be referred to as pseudo differential structure.

In the embodiment shown in FIG. 7, the sensor is always operated beyond its so-called pull-in point. In such an embodiment, if for some reason the displacement measurement becomes erroneous, for example due to the capacitances of amplifier arrangement 71, 72 leaking, there is a possibility that the membrane of the sensor will collapse. In some embodiments, to prevent this a refresh cycle is introduced in which the sensor is biased below its pull-in point. This allows the membrane to return to its equilibrium position.

While the above embodiment has been described as using displacement feedback ($k_d \neq 0$) and velocity feedback ($f_v \neq 0$), in some embodiments only one of these kinds of feedback may be used.

The gain of an embodiment using feedback like the embodiments of FIGS. 6 and 7 essentially follows the same general law as explained for the case without feedback and as expressed for example in equation (9). However, with feedback the effective time constant τ may be chosen smaller and thus higher gains or higher frequencies may be obtained in some embodiments. However, if the quenching frequency and gain offered by an embodiment without feedback are sufficient for a particular application, an embodiment without feedback may be used as the circuit structure is more simple. Furthermore, in case with feedback the initial state is not $-F_a/k'$, but $$x_0'(0) = \frac{-F_a}{k' - mk_d} \qquad (27)$$

In other words, the initial displacement caused by the acoustic force in case of a microphone or caused by acceleration or gravity in case of an accelerometer differs from the case without feedback.

The above-described embodiments are not to be construed as limiting, but have been provided merely to provide a better understanding of various possibilities to implement the present invention. For example, circuit elements shown may be replaced by other elements having the same or a similar function or, depending on the circumstances, may be omitted altogether.

What is claimed is:

1. An apparatus, comprising:
    a sensor comprising a movable part and at least two electrodes; and
    biasing circuitry configured to alternately apply at least one first voltage and at least one second voltage to the at least two electrodes, the first voltage having a magnitude being different than a magnitude of the second voltage.

2. The apparatus of claim 1, wherein applying said at least one first voltage is associated with a stable state of said movable part and applying said at least one second voltage is associated with an unstable state of said movable part.

3. The apparatus of claim 1, further comprising a feedback path from an output of said sensor to said biasing circuitry, said biasing circuitry being configured to provide said at least one first voltage and said at least one second voltage depending on a signal received via said feedback path.

4. The apparatus of claim 1, wherein said sensor comprises at least one of a microphone, an accelerometer, or a gyroscope.

5. The apparatus of claim 1, wherein said sensor is implemented as a microelectromechanical system.

6. The apparatus of claim 1, wherein said at least two electrodes comprise a first plate and a second plate, and wherein said movable part comprises a membrane suspended between said first plate and said second plate.

7. A method, comprising:
    providing a sensor comprising a movable part arranged between at least two electrodes, and
    alternately switching a first biasing voltage, applied directly to said movable part, between at least two different values, or alternately switching a second biasing voltage, applied to at least one electrode, of the at least two electrodes associated with said movable part, between at least two different values.

8. The method of claim 7, wherein said switching of said first biasing voltage or said second biasing voltage comprises switching said sensor between a stable state and an unstable state.

9. The method of claim 7, further comprising providing said first biasing voltage or said second biasing voltage based on an output of said sensor.

10. The method of claim 7, further comprising,
generating a first feedback signal based on a first amplification of an output of said sensor; and
generating a second feedback signal based on a second amplification of said output of said sensor,
said second amplification being different from said first amplification.

11. The method of claim 7, wherein said sensor comprises at least one of a microphone, an accelerometer, or a gyroscope.

* * * * *